US010361476B2

(12) United States Patent
Ou

(10) Patent No.: US 10,361,476 B2
(45) Date of Patent: Jul. 23, 2019

(54) ANTENNA STRUCTURES FOR WIRELESS COMMUNICATIONS

(71) Applicant: QUALCOMM Incorporated, San Diego, CA (US)

(72) Inventor: Yu-Chin Ou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 158 days.

(21) Appl. No.: 15/014,602

(22) Filed: Feb. 3, 2016

(65) Prior Publication Data

US 2016/0351996 A1 Dec. 1, 2016

Related U.S. Application Data

(60) Provisional application No. 62/166,496, filed on May 26, 2015.

(51) Int. Cl.
*H01Q 1/24* (2006.01)
*H01Q 1/42* (2006.01)
(Continued)

(52) U.S. Cl.
CPC ............ *H01Q 1/243* (2013.01); *H01Q 1/241* (2013.01); *H01Q 1/42* (2013.01); *H01Q 9/0407* (2013.01);
(Continued)

(58) Field of Classification Search
CPC .......... H01Q 1/241; H01Q 1/42; H01Q 13/02; H01Q 9/0407; H01Q 21/064; H01Q 21/065
See application file for complete search history.

(56) References Cited

U.S. PATENT DOCUMENTS 4,761,654 A * 8/1988 Zaghloul .............. H01Q 9/0414
343/700 MS
5,086,304 A * 2/1992 Collins ................ H01Q 21/064
343/778
(Continued)

FOREIGN PATENT DOCUMENTS

CN 203482547 U 3/2014
CN 204465618 U 7/2015

OTHER PUBLICATIONS

ISA/EPO, International Search Report and Written Opinion of the International Searching Authority, Int'l App. No. PCT/US2016/028776, dated Jul. 21, 2016, European Patent Office, Rijswijk, NL, 12 pgs.
(Continued)

*Primary Examiner* — Dameon E Levi
*Assistant Examiner* — Ab Salam Alkassim, Jr.
(74) *Attorney, Agent, or Firm* — Holland & Hart LLP/Qualcomm

(57) ABSTRACT

Methods, systems, and devices are described for wireless communication using the mmW spectrum. In particular, an antenna structure may be designed to integrate with an external housing of a wireless communication device. For example, the external housing may include a cavity that facilitates reception and/or transmission of radio frequency communication signals by an antenna element of the antenna structure. Such an antenna structure may be designed to be relatively compact to deal with the limited real estate available on modern wireless communication devices (e.g., cellular telephones).

22 Claims, 11 Drawing Sheets

(51) Int. Cl.
  *H01Q 9/04* (2006.01)
  *H01Q 13/02* (2006.01)
  *H01Q 19/00* (2006.01)
  *H01Q 21/06* (2006.01)
  *H01Q 23/00* (2006.01)
(52) U.S. Cl.
  CPC ............. *H01Q 13/02* (2013.01); *H01Q 19/00* (2013.01); *H01Q 21/064* (2013.01); *H01Q 21/065* (2013.01); *H01Q 23/00* (2013.01)

(56) References Cited

U.S. PATENT DOCUMENTS

| | | | | |
|---|---|---|---|---|
| 5,426,442 | A * | 6/1995 | Haas | H01Q 13/0208 343/772 |
| 5,583,524 | A * | 12/1996 | Milroy | H01Q 13/20 343/767 |
| 5,757,331 | A * | 5/1998 | Yoneyama | H01Q 13/28 333/237 |
| 6,081,239 | A * | 6/2000 | Sabet | H01Q 1/40 343/700 MS |
| 6,642,907 | B2 | 11/2003 | Hamada et al. | |
| 6,670,930 | B2 * | 12/2003 | Navarro | H01Q 21/0087 343/700 MS |
| 7,250,909 | B2 * | 7/2007 | Fujishima | H01Q 1/243 343/700 MS |
| 7,283,085 | B2 * | 10/2007 | Lee | G01S 13/89 342/372 |
| 7,903,040 | B2 * | 3/2011 | Gevorgian | H01P 1/2005 343/767 |
| 8,138,977 | B2 | 3/2012 | Zhang et al. | |
| 8,213,757 | B2 * | 7/2012 | Harrysson | H01Q 1/1271 385/120 |
| 8,325,094 | B2 * | 12/2012 | Ayala Vazquez | H01Q 1/2258 343/700 MS |
| 8,467,737 | B2 * | 6/2013 | Choudhury | H01L 23/49822 455/73 |
| 8,780,012 | B2 * | 7/2014 | Llombart Juan | H01Q 19/06 343/911 R |
| 8,896,487 | B2 * | 11/2014 | Chiang | G06F 1/1616 343/700 MS |
| 9,265,151 | B2 * | 2/2016 | Junemann | H01Q 1/38 |
| 9,343,817 | B2 * | 5/2016 | Pan | H01Q 1/20 |
| 9,667,290 | B2 * | 5/2017 | Ouyang | H04B 1/1081 |
| 9,692,117 | B2 * | 6/2017 | Iwanaka | H01Q 21/0006 |
| 9,692,126 | B2 * | 6/2017 | Sharawi | H01Q 3/40 |
| 9,742,077 | B2 * | 8/2017 | Pan | H01Q 1/20 |
| 9,972,889 | B2 * | 5/2018 | Hong | H01Q 1/243 |
| 9,972,892 | B2 * | 5/2018 | Noori | H01Q 1/2258 |
| 10,084,490 | B2 * | 9/2018 | Ouyang | H04B 1/1081 |
| 10,116,064 | B2 * | 10/2018 | Hu | H01Q 21/0025 |
| 2003/0067410 | A1 * | 4/2003 | Puzella | H01Q 9/0407 343/700 MS |
| 2003/0122724 | A1 * | 7/2003 | Shelley | H01Q 1/525 343/786 |
| 2004/0174315 | A1 * | 9/2004 | Miyata | H01Q 13/22 343/770 |
| 2005/0200531 | A1 * | 9/2005 | Huang | H01Q 19/026 343/700 MS |
| 2007/0171127 | A1 * | 7/2007 | Mizugaki | H01Q 21/064 343/700 MS |
| 2007/0257853 | A1 * | 11/2007 | Gevorgian | H01P 1/2005 343/787 |
| 2007/0285314 | A1 * | 12/2007 | Mortazawi | H01Q 1/3233 342/375 |
| 2008/0088519 | A1 * | 4/2008 | Quan | H01Q 21/064 343/770 |
| 2009/0153426 | A1 * | 6/2009 | Worl | H01Q 21/0075 343/776 |
| 2009/0251357 | A1 * | 10/2009 | Margomenos | G01S 7/032 342/70 |
| 2009/0251377 | A1 | 10/2009 | Peng et al. | |
| 2010/0066631 | A1 * | 3/2010 | Puzella | H01Q 1/02 343/853 |
| 2010/0231475 | A1 * | 9/2010 | Ou | H01Q 13/0258 343/776 |
| 2010/0309089 | A1 * | 12/2010 | Collinson | H01Q 1/42 343/872 |
| 2011/0234466 | A1 * | 9/2011 | Yamada | H01Q 13/06 343/786 |
| 2012/0157175 | A1 * | 6/2012 | Golko | G06F 1/1698 455/575.7 |
| 2012/0212384 | A1 * | 8/2012 | Kam | H01Q 1/2283 343/767 |
| 2012/0249388 | A1 * | 10/2012 | Hansen | H01Q 1/2266 343/753 |
| 2012/0280380 | A1 * | 11/2012 | Kamgaing | H01Q 1/1271 257/679 |
| 2013/0021208 | A1 | 1/2013 | Seok et al. | |
| 2013/0278468 | A1 * | 10/2013 | Yehezkely | H01Q 1/24 343/702 |
| 2014/0132473 | A1 * | 5/2014 | Isom | H01Q 1/38 343/855 |
| 2014/0361945 | A1 * | 12/2014 | Misra | H01Q 1/42 343/789 |
| 2015/0084830 | A1 * | 3/2015 | Elsherbini | H01Q 9/0414 343/893 |
| 2015/0085459 | A1 * | 3/2015 | Pu | H01Q 1/243 361/782 |
| 2015/0116169 | A1 * | 4/2015 | Ying | H01Q 21/28 343/729 |
| 2015/0194724 | A1 * | 7/2015 | Yepes | H01Q 1/2291 343/702 |
| 2015/0214633 | A1 * | 7/2015 | Pan | H01Q 1/20 343/893 |
| 2015/0236415 | A1 * | 8/2015 | Bily | H01Q 3/34 342/372 |
| 2015/0289401 | A1 * | 10/2015 | Hikino | H01Q 1/242 174/520 |
| 2015/0325925 | A1 * | 11/2015 | Kamgaing | H01L 23/66 343/893 |
| 2015/0349421 | A1 * | 12/2015 | Sharawi | H01Q 3/40 342/373 |
| 2016/0006118 | A1 * | 1/2016 | Maruyama | H01Q 13/02 343/702 |
| 2016/0049723 | A1 * | 2/2016 | Baks | H01L 23/49827 343/848 |
| 2016/0308626 | A1 * | 10/2016 | Mow | H04B 17/14 |
| 2017/0069958 | A1 * | 3/2017 | Ko | H01Q 1/243 |
| 2017/0201011 | A1 * | 7/2017 | Khripkov | H01Q 1/243 |
| 2017/0230124 | A1 * | 8/2017 | Mow | H04B 17/14 |
| 2017/0294705 | A1 * | 10/2017 | Khripkov | H01Q 1/243 |
| 2017/0302306 | A1 * | 10/2017 | Ouyang | H04B 1/1081 |
| 2017/0309991 | A1 * | 10/2017 | Noori | H01Q 5/49 |
| 2017/0309992 | A1 * | 10/2017 | Noori | H01Q 1/243 |
| 2018/0026341 | A1 * | 1/2018 | Mow | H01Q 1/2291 343/702 |
| 2018/0069297 | A1 * | 3/2018 | Jin | H01Q 1/243 |
| 2018/0090815 | A1 * | 3/2018 | Shirinfar | H01Q 1/246 |
| 2018/0159203 | A1 * | 6/2018 | Baks | H01Q 1/2283 |
| 2018/0183150 | A1 * | 6/2018 | Sienkiewicz | G01R 29/10 |
| 2018/0205134 | A1 * | 7/2018 | Khan | H01Q 11/08 |
| 2018/0205155 | A1 * | 7/2018 | Mizunuma | H01L 25/00 |
| 2018/0212307 | A1 * | 7/2018 | Kim | H01Q 1/2283 |
| 2018/0241129 | A1 * | 8/2018 | Pance | H01Q 9/0485 |

OTHER PUBLICATIONS

Rebeiz, "Integrated Horn Antennas for Millimeter-Wave Applications," IEEE Antennas and Propagation Magazine, Feb. 1992 pp. 7-16.

* cited by examiner

ANTENNA STRUCTURES FOR WIRELESS COMMUNICATIONS

CROSS REFERENCES

The present application for patent claims priority to U.S. Provisional Patent Application No. 62/166,496 by Ou, entitled "Antenna Structures For Wireless Communications," filed May 26, 2015, assigned to the assignee hereof.

BACKGROUND

Field of the Disclosure

The present disclosure, for example, relates to wireless communications systems, and more particularly to antenna structures for wireless communications.

Description of Related Art

Wireless communications systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

By way of example, a wireless multiple-access communication system may include a number of base stations, each simultaneously supporting communication for multiple communication devices, otherwise known as user equipments (UEs). A base station may communicate with UEs on downlink channels (e.g., for transmissions from a base station to a UE) and uplink channels (e.g., for transmissions from a UE to a base station).

Communication systems may employ a licensed spectrum, an unlicensed spectrum, or both. The unlicensed millimeter wavelength mmW spectrum in a high gigahertz (GHz) band is becoming a promising technology, for example, for multi-gigabit wireless communication. Compared to other lower frequency systems, the spectrum around 60 GHz holds several advantages including an increased unlicensed bandwidth, compact size of a transceiver due to small wavelength (about 5 mm), and less interference due to high atmospheric absorption. However, there are several challenges associated with this spectrum, such as reflection and scattering losses, high penetration loss and high path loss, which limit the range of coverage at 60 GHz. To overcome this issue, directional transmission may be employed. Thus, a technique known as beamforming utilizing multi-element antenna arrays may be employed for mmW wireless communication.

Even with beamforming, however, communications using the mmW spectrum may benefit from an antenna structure that is designed particularly for such wavelengths. Conventional antenna structures designed for lower frequencies (e.g., 800 MHz, 900 MHz, 1800 MHz, 1900 MHz, 2100 MHz, etc.) may include a single omnidirectional antenna (sometimes two or three for diversity) and may be unsuitable for mmW spectrum applications.

SUMMARY

The described features generally relate to one or more improved systems, methods, and/or apparatuses for wireless communication using the mmW spectrum. In particular, an antenna structure may be designed to integrate with an external housing of a wireless communication device. For example, the external housing may include a cavity that facilitates reception and/or transmission of radio frequency communication signals by an antenna element of the antenna structure. Such an antenna structure may be designed to be relatively compact to deal with the limited real estate available on modern wireless communication devices (e.g., cellular telephones).

A wireless communication device is described. The wireless communication device may include an external housing. A substrate supporting an antenna element may be disposed adjacent an inner surface of the external housing. A cavity may be formed in the external housing. The cavity may be aligned with the antenna element such that the antenna element receives and transmits radio frequency communication signals through the cavity during operation of the wireless communication device.

The external housing may be made, at least partially, of a metallic material. Alternatively or additionally, the external housing may be made of a plastics material. In such case, a metallic material may be disposed on a wall of the at least one cavity.

A wall of the cavity may be tapered to slope towards the antenna element.

The cavity may have a rectangular cross-section and may define a first pair of opposing walls that are tapered to slope towards the antenna element. In such case, the cavity may define a second pair of opposing walls that are tapered to slope towards the antenna element.

A dielectric material may fill the cavity. In such case, the dielectric material may be a plastics material.

An auxiliary cavity may be formed in the substrate and aligned with the antenna element and the cavity.

The antenna element may be implemented as a plurality of antenna elements of an antenna array. In such case, the cavity may be implemented as a corresponding plurality of cavities. Each of the plurality of cavities may be aligned with one of the plurality of antenna elements.

The external housing may include a first portion and a second portion, with the cavity formed in the first portion of the external housing. In such case, the first portion may be insertable into the second portion to form the external housing.

A layer of material may be disposed on an exterior surface of the external housing. The layer of material may cover the cavity formed in the external housing.

The antenna element may be a millimeter wavelength antenna element.

Another wireless communication device is described. The wireless communication device may include: means for housing the wireless communication device; means for supporting an antenna element, the means for supporting disposed adjacent an inner surface of the means for housing; and, a cavity formed in the means for housing, the cavity aligned with the antenna element such that the antenna element receives and transmits radio frequency communication signals through the cavity during operation of the wireless communication device. The apparatus may include these and other features described above and further herein.

A method of fabricating a wireless communication device is described. The method may involve: providing an external housing for the wireless communication device; forming a cavity in the external housing; and, assembling a substrate supporting an antenna element to the external housing with the substrate disposed adjacent an inner surface of the external housing and the antenna element aligned with the cavity such that the antenna element receives and transmits radio frequency communication signals through the cavity during operation of the wireless communication device. The method may include fabricating these and other features described above and further herein.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

When a mmW antenna is included in a wireless communication device, the mmW antenna may be configured to receive and/or transmit communication signals through an external housing of the wireless communication device. The external housing conventionally may form a rear cover of the device with a display screen disposed on a front side of the device. Due to electromagnetic shielding by the display screen, reception/transmission of communication signals may be restricted to be through the rear cover. Further, electromagnetic shielding may prohibit a rear cover made of a metallic material from being disposed over the mmW antenna.

A plastics material may be used for the rear cover at least over the mmW antenna to allow reception/transmission of communication signals therethrough. However, the radiation of such communication signals may still be distorted by reflection and/or refraction caused by the rear cover over the mmW antenna.

Therefore, an antenna structure may be designed to integrate with the external housing of the wireless communication device. The external housing may include a cavity that facilitates reception and/or transmission of radio frequency communication signals by an antenna element of the antenna structure. As such, either a metallic material or a non-metallic (e.g., plastics) material may be used for the external housing. An antenna element of the antenna structure may be aligned with the cavity to receive and/or transmit communication signals via the cavity.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Figure 1:
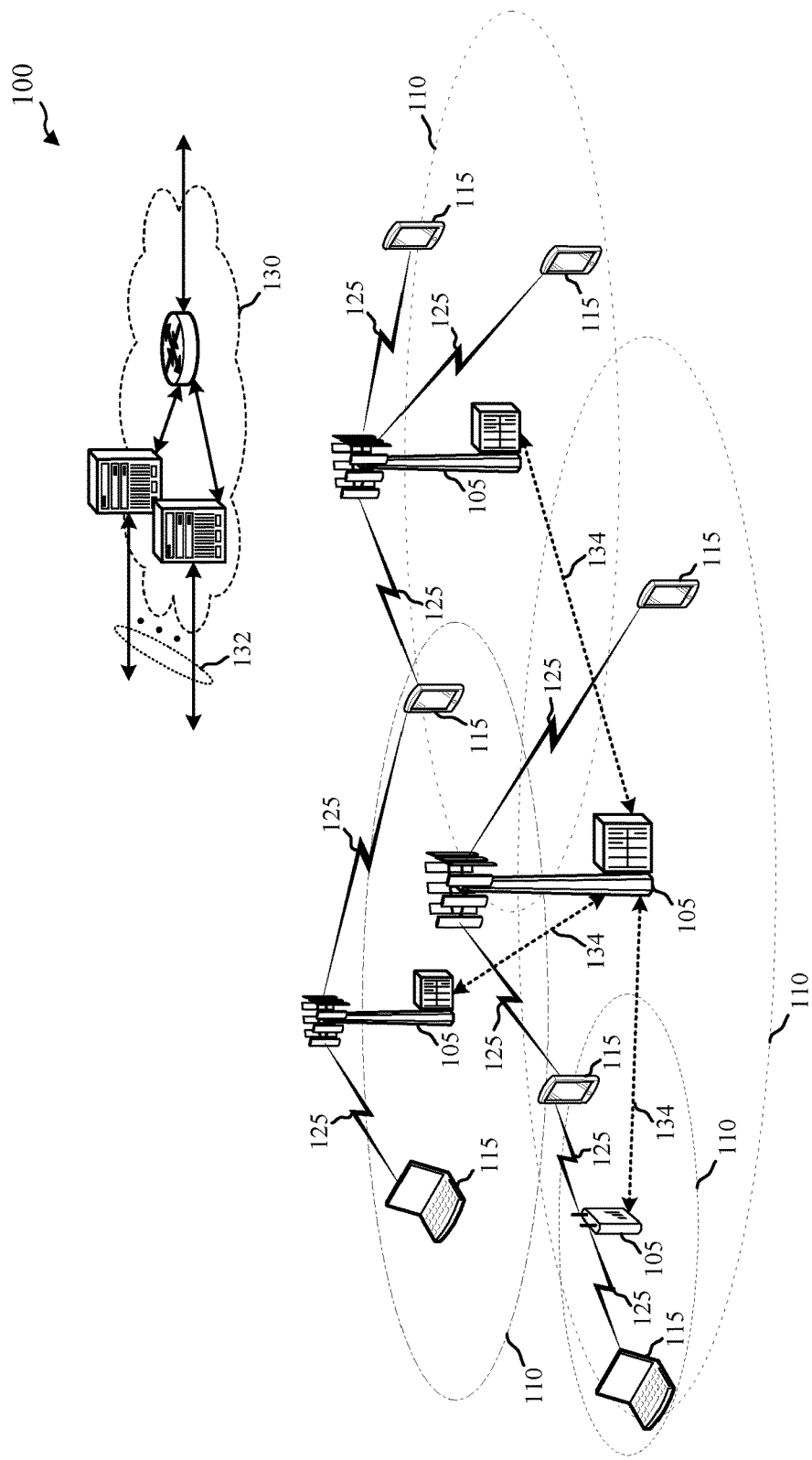
FIG. 1 shows a block diagram of a wireless communications system, in accordance with various aspects of the present disclosure.

FIG. 1 illustrates an example of a wireless communications system 100 in accordance with various aspects of the disclosure. The wireless communications system 100 includes base stations 105, UEs 115, and a core network 130. The core network 130 may provide user authentication, access authorization, tracking, Internet Protocol (IP) connectivity, and other access, routing, or mobility functions. The base stations 105 interface with the core network 130 through backhaul links 132 (e.g., S1, etc.) and may perform radio configuration and scheduling for communication with the UEs 115, or may operate under the control of a base station controller (not shown). In various examples, the base stations 105 may communicate, either directly or indirectly (e.g., through core network 130), with each other over backhaul links 134 (e.g., X1, etc.), which may be wired or wireless communication links.

The base stations 105 may wirelessly communicate with the UEs 115 via one or more base station antennas. Each of the base station 105 sites may provide communication coverage for a respective geographic coverage area 110. In some examples, base stations 105 may be referred to as a base transceiver station, a radio base station, an access point, a radio transceiver, a NodeB, eNodeB (eNB), Home NodeB, a Home eNodeB, or some other suitable terminology. The geographic coverage area 110 for a base station 105 may be divided into sectors making up only a portion of the coverage area (not shown). The wireless communications system 100 may include base stations 105 of different types (e.g., macro and/or small cell base stations). There may be overlapping geographic coverage areas 110 for different technologies.

In some examples, the wireless communications system 100 is an LTE/LTE-A network. In LTE/LTE-A networks, the term evolved Node B (eNB) may be generally used to describe the base stations 105, while the term UE may be generally used to describe the UEs 115. The wireless communications system 100 may be a Heterogeneous LTE/LTE-A network in which different types of eNBs provide coverage for various geographical regions. For example, each eNB or base station 105 may provide communication coverage for a macro cell, a small cell, and/or other types of cell. The term "cell" is a 3GPP term that can be used to describe a base station, a carrier or component carrier associated with a base station, or a coverage area (e.g., sector, etc.) of a carrier or base station, depending on context.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell may cover a relatively smaller geographic area and may allow unrestricted access by UEs with service subscriptions with the network provider. A femto cell also may cover a relatively small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB or a home eNB. An eNB may support one or multiple (e.g., two, three, four, and the like) cells (e.g., component carriers).

The wireless communications system 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The communication networks that may accommodate some of the various disclosed examples may be packet-based networks that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use Hybrid ARQ (HARD) to provide retransmission at the MAC layer to improve link efficiency. In the control plane, the Radio Resource Control (RRC) protocol layer may provide establishment, configuration, and maintenance of an RRC connection between a UE 115 and the base stations 105 or core network 130 supporting radio bearers for the user plane data. At the Physical (PHY) layer, the transport channels may be mapped to physical channels.

The UEs 115 are dispersed throughout the wireless communications system 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, or the like. A UE may be able to communicate with various types of base stations and network equipment including macro eNBs, small cell eNBs, relay base stations, and the like.

The communication links 125 shown in wireless communications system 100 may include uplink (UL) transmissions from a UE 115 to a base station 105 and/or downlink (DL) transmissions from a base station 105 to a UE 115. The downlink transmissions may also be called forward link transmissions while the uplink transmissions may also be called reverse link transmissions. Each communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. The communication links 125 may transmit bidirectional communications using FDD (e.g., using paired spectrum resources) or TDD operation (e.g., using unpaired spectrum resources). Frame structures for FDD (e.g., frame structure type 1) and TDD (e.g., frame structure type 2) may be defined.

In some embodiments of the system 100, base stations 105 and/or UEs 115 may include multiple antennas for employing antenna diversity schemes to improve communication quality and reliability between base stations 105 and UEs 115. Additionally or alternatively, base stations 105 and/or UEs 115 may employ multiple-input, multiple-output (MIMO) techniques that may take advantage of multi-path environments to transmit multiple spatial layers carrying the same or different coded data.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

One or more of the base stations 105 may be a mmW base station. In some cases, the wireless communications system 100 may be a mmW communications system configured to communicate with the UEs 115 via mmW radio frequency communication signals. In other cases, the wireless communications system 100 may be heterogeneous, such as a network involving LTE/LTE-A base stations that may communicate with the UEs 115 using LTE/LTE-A frequencies and mmW base stations that may communicate with the UEs 115 via mmW frequencies.

As discussed above, wireless communications using the mmW spectrum may benefit from an antenna structure that is designed particularly for that spectrum. Thus, mmW base stations 105 of the wireless communications system 100 and the UEs 115 configured for mmW communications may have specific antenna designs. The following describes antenna designs for mmW communications with respect to wireless communication devices, such as cellular telephones, for the sake of clarity. However, as appropriate or desired, such antenna designs may be applicable to mmW base stations as well.

Figure 2:
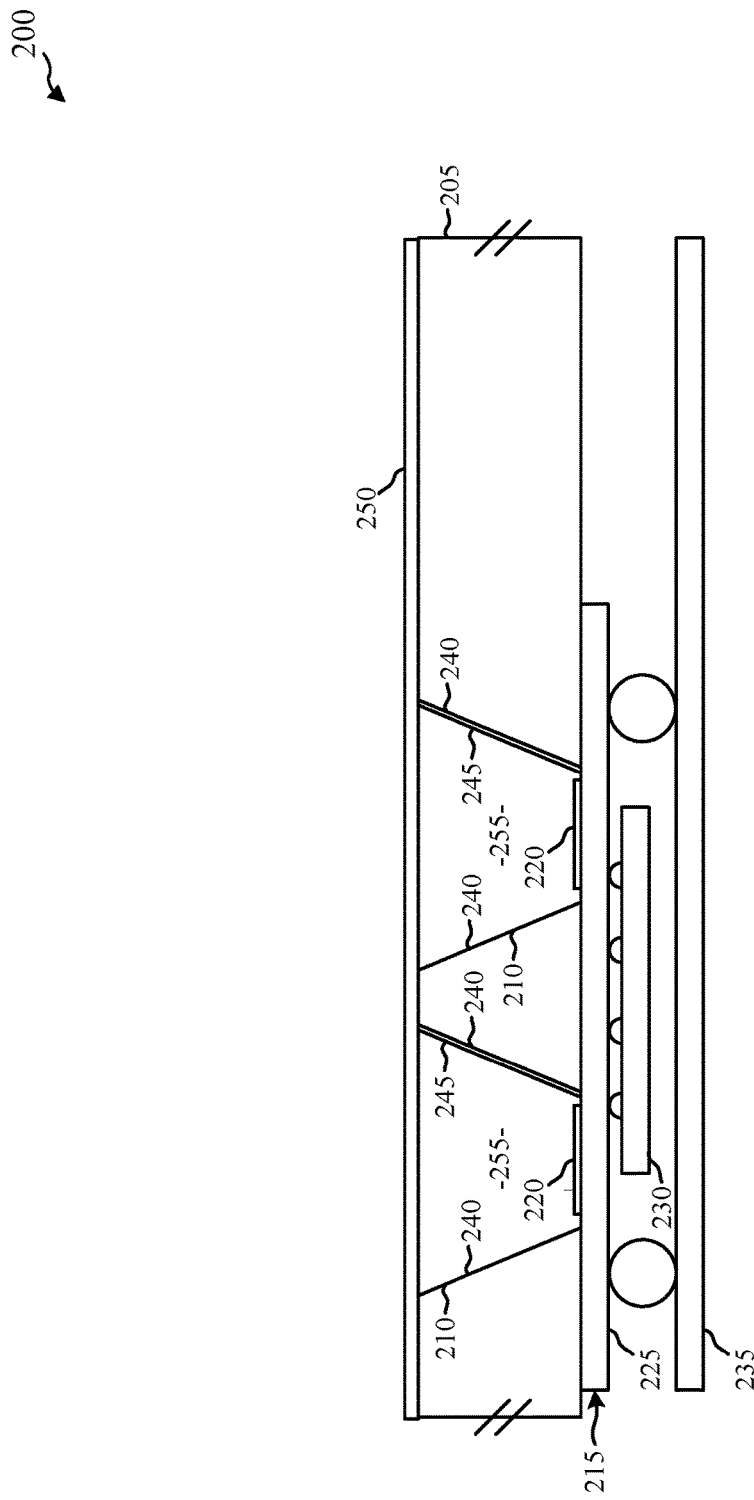
FIG. 2 shows a cross-sectional view of an example of an antenna design, in accordance with various aspects of the present disclosure.

Turning now to FIG. 2, a cross-sectional view of an example of an antenna design 200 for a wireless communication device is shown, in accordance with various aspects of the present disclosure. The antenna design 200 may include an external housing 205. One or more cavities 210 may be formed in the external housing 205. In the cross-sectional view of FIG. 2, two cavities 210 are shown as an example. The thickness of the external housing 205/depth of the cavities 210 may be a design parameter that may be tailored for a given application.

The antenna design 200 also may include an antenna structure 215 that includes one or more antenna elements 220 and a substrate 225 that supports the antenna element(s) 220. While the antenna elements 220 are shown as being disposed on top of the substrate 225, it should be understood that the antenna elements 220 may be coplanar with the substrate 225 or recessed, as appropriate or desired. The substrate 225 may be a printed circuit board (PCB), for example. The substrate 225 may be disposed adjacent (e.g., along) an inner surface of external housing 205. Thus, the substrate 225 may be situated such that no gap is between the substrate 225 and the external housing 205, which may prevent signal loss due to reflections.

In the cross-sectional view of FIG. 2, two antenna elements 220 are shown as an example. The antenna elements 220 may be aligned with respective cavities 210 in the external housing 205 so that the antenna elements 220 may receive and/or transmit communications signals via the respective cavities 210. Thus, the number and arrangement of the cavities 210 may correspond to the number and arrangement of the antenna elements 220 according to the particular antenna design. For example, the cross-sectional view of FIG. 2 may represent an antenna design including a 2×1, 2×2, 2×3, 2×4, 2×5 or 2×6, etc. array of antenna elements 220 with a corresponding array of cavities 210 in the external housing 205.

The antenna structure 215 also may include a radio frequency integrated circuit (RFIC) 230 that may be electrically connected to the antenna elements 220 via the substrate 225. The RFIC 230 may provide operational control for the antenna elements 220 (e.g., for receiving/transmitting communication signals via the antenna elements 220).

For the sake of understanding, the antenna design 200 is illustrated as including a main control board 235 (e.g., another PCB) that provides operational control of the wireless communication device, including but not limited to communications control. The main control board 235 may be electrically connected to the RFIC 230 and the antenna elements 220 via the substrate 225 to facilitate mmW communications for the wireless communication device.

As shown, each of the cavities 210 may include a wall 240 that is tapered to slope towards the respective antenna element 220. The taper of the walls 240 may facilitate collection of communication signals to the respective antenna elements 220 and/or radiation of communication signals from the respective antenna elements 220 for reception and/or transmission, respectively. The taper of the walls 240 may be a fixed slope or variable (e.g., curvilinear), as appropriate or desired. In the case where the cavities 210 have a curvilinear cross-sectional perimeter (e.g., a circular or elliptical shape when viewed from above in FIG. 2), each cavity 210 may have a single wall 240. In the case where the cavities 210 have a rectangular cross-sectional perimeter (e.g., a rectangular or square shape when viewed from above in FIG. 2), each cavity 210 may have two pairs of opposing walls 240.

The external housing 205 may be made of a plastics material (or other non-metallic material, such as glass). In such case, the walls 240 of the cavities 210 may have a layer of metallic material 245 (e.g., gold plating) disposed thereon, as represented by the right side of the cavities in FIG. 2. The metallic material 245 may collect/radiate communication signals for the respective antenna elements 220 by reflecting such signals.

Alternatively, the external housing 205 may be made of a metallic material. In such case, the walls 240 of the cavities 210 may collect/radiate communication signals for the respective antenna elements 220 by reflecting such signals, without an additional layer of material, as represented by the left side of the cavities in FIG. 2.

The external housing 205 may be provided with a coating 250, such as a protective layer, on an outer surface thereof. The coating 250 may extend over the cavities 210 as shown. The coating 250 may be a relatively thin layer of colored material that obscures a visual appearance of the cavities 210 for aesthetic purposes, without adversely impacting reception/transmission of mmW communication signals therethrough.

Alternatively or additionally, the cavities 210 may be filled with a suitable dielectric or non-metal material 255 to provide a coplanar surface with the outer surface of the external housing 205. In the case of including the coating 250, the material 255 may provide support for the coating 250 over the cavities 210, as opposed to having the cavities 210 being evacuated or filled with air or another gas which may not provide suitable support for the coating. The material 255 may be transmissive (e.g., transparent) to mmW communication signals so as not to adversely impact reception/transmission of mmW communication signals therethrough. For example, plastics materials, such as resins (e.g., Noryl®) or polycarbonates (e.g., Lexan®), may be used for the material 255.

Figure 3:
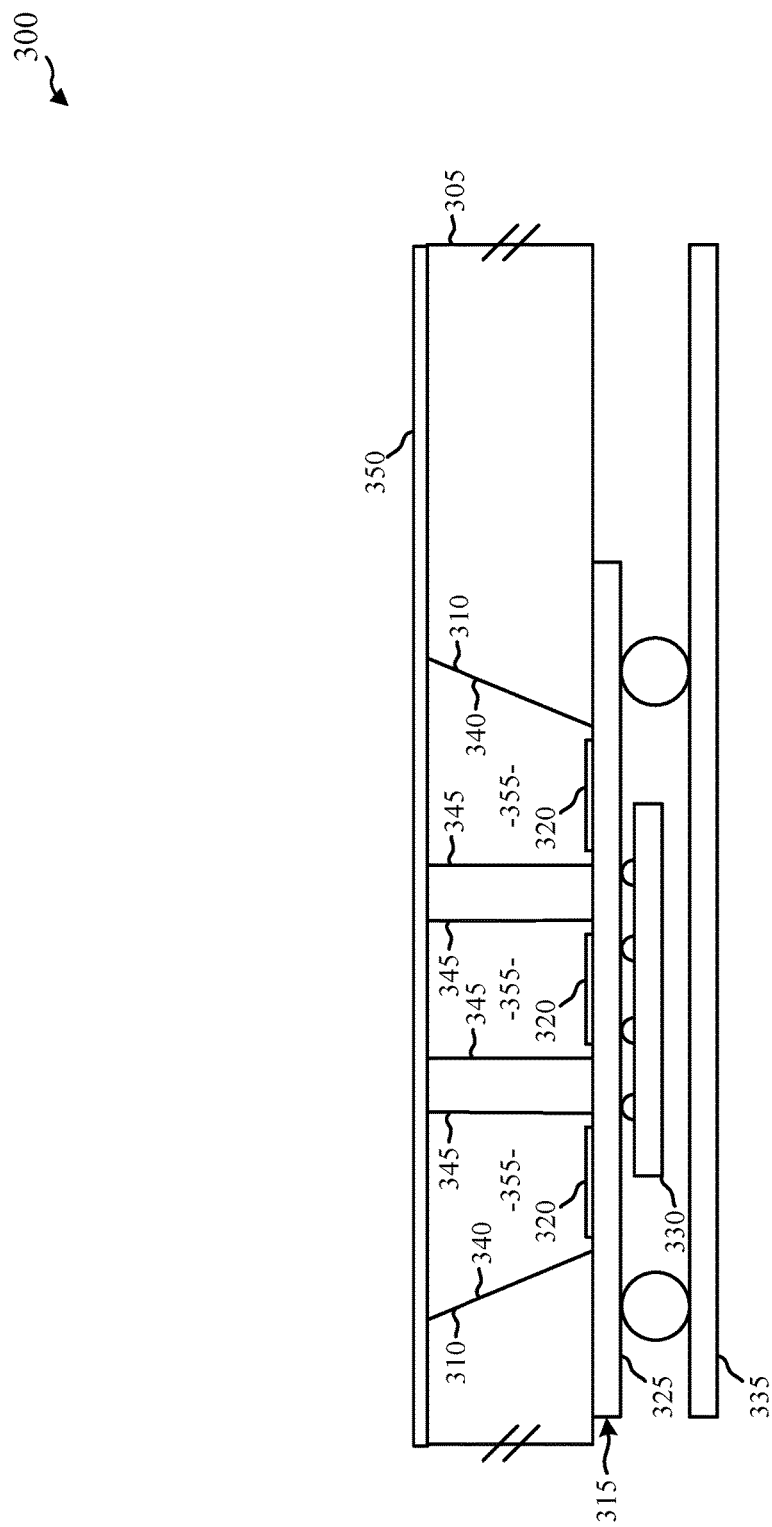
FIG. 3 shows a cross-sectional view of another example of an antenna design, in accordance with various aspects of the present disclosure.

FIG. 3 shows a cross-sectional view of another example of an antenna design 300, in accordance with various aspects of the present disclosure. The antenna design 300 may include an external housing 305. One or more cavities 310 may be formed in the external housing 305. In the cross-sectional view of FIG. 3, three cavities 310 are shown as an example.

The antenna design 300 also may include an antenna structure 315 that includes one or more antenna elements 320 and a substrate 325 that supports the antenna element(s) 320. In the cross-sectional view of FIG. 3, three antenna elements 320 are shown as an example. The antenna elements 320 may be aligned with respective cavities 310 in the external housing 305 so that the antenna elements 320 may receive and/or transmit communications signals via the respective cavities 310. Thus, the number and arrangement of the cavities 310 may correspond to the number and arrangement of the antenna elements 320 according to the particular antenna design. For example, the cross-sectional view of FIG. 3 may represent an antenna design including a 3×1, 3×2, 3×3, 3×4, 3×5 or 3×6, etc. array of antenna elements 320 with a corresponding array of cavities 310 in the external housing 305.

The antenna structure 315 also may include an RFIC 330 that may be electrically connected to the antenna elements 320 via the substrate 325. For the sake of understanding, the antenna design 300 is illustrated as including a main control board 335 that may be electrically connected to the RFIC 330 and the antenna elements 320 via the substrate 325 to facilitate mmW communications for the wireless communication device.

As shown, the cavities 310 on the right and left each may include a wall 340 that is tapered to slope towards the respective antenna element 320. The cavities 310 on the right and left each may include an opposing wall 345 that is less tapered (e.g., not tapered as shown). Similarly, the cavity 310 in the middle may have one or more walls that are less tapered (e.g., not tapered as shown). This arrangement may allow the antenna design 300 to be more compact as compared with an antenna design according to FIG. 2 with a same number of antenna elements and cavities each with tapered wall(s). For example, with the cavities 310 having a rectangular cross-sectional perimeter, outer walls 340 of each of the cavities 310 may be tapered and inner walls 345 (e.g., each wall of a cavity that faces opposite an adjacent wall of another cavity) may be less or not tapered.

The external housing 305 may be provided with a coating 350, such as a protective layer, on an outer surface thereof. Alternatively or additionally, the cavities 310 may be filled with a suitable dielectric or non-metal material 355 to provide a coplanar surface with the outer surface of the external housing 305.

Figure 4:
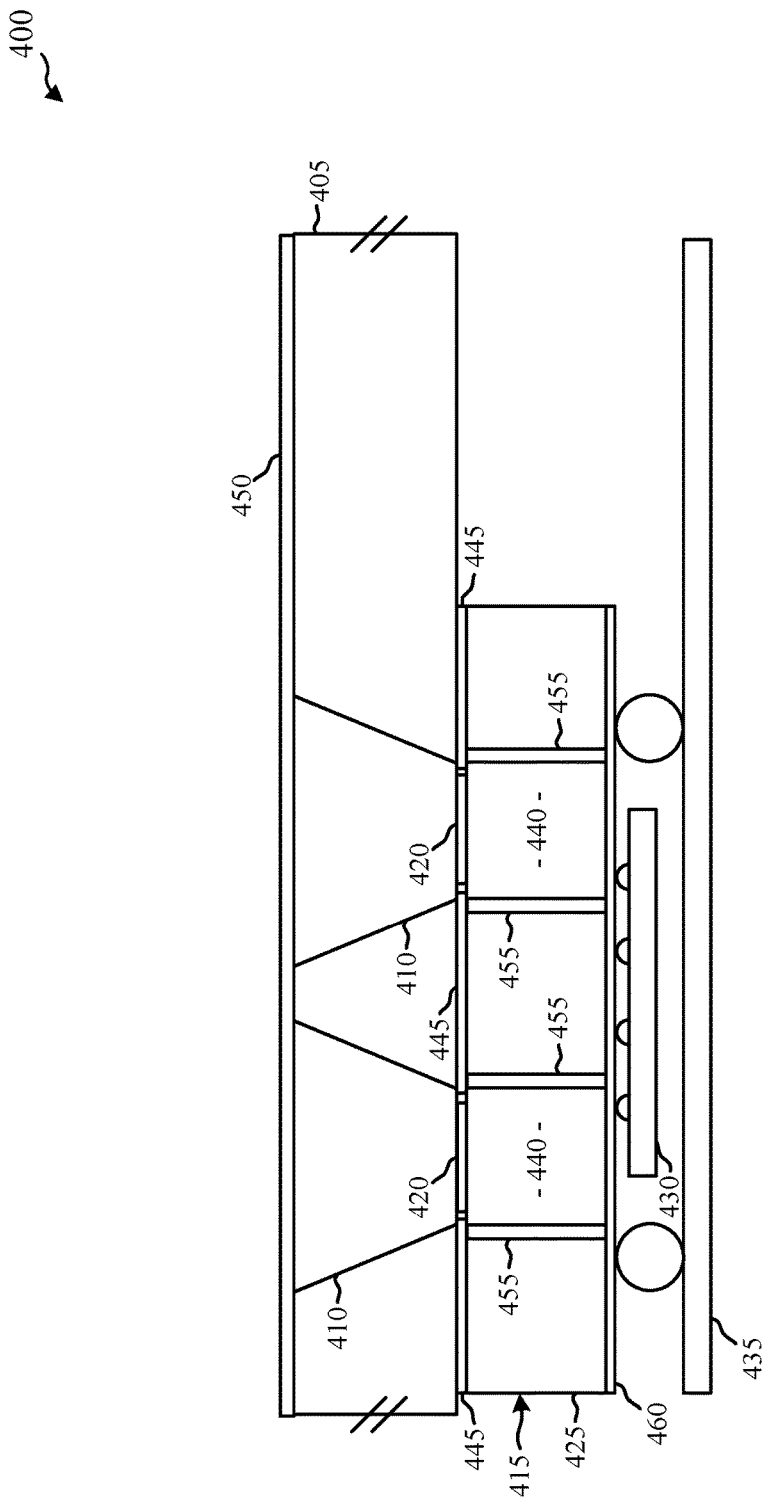
FIG. 4 shows a cross-sectional view of yet another example of an antenna design, in accordance with various aspects of the present disclosure.

FIG. 4 shows a cross-sectional view of yet another example of an antenna design 400, in accordance with various aspects of the present disclosure. As shown, the antenna design 400 may include an external housing 405 with cavities 410 formed therein, an antenna structure 415 including antenna elements 420 and a substrate 425 that supports the antenna elements 420, an RFIC 430, a main control board 435 and a coating 450, each of which may be as described above with respect to FIGS. 2 and/or 3.

As shown, the antenna design 400 also may include an auxiliary cavity 440 for the respective cavities 410. Each of the auxiliary cavities 440 may be formed in the substrate 425 and aligned with the respective cavity 410 and the corresponding antenna element 420. The auxiliary cavities 440 may be filled with a suitable dielectric material such that the antenna elements 420 are situated between the dielectric materials of the corresponding cavity 410 and auxiliary cavity 440.

A first metal layer 445 may be disposed on top of the substrate 425 with cutout areas corresponding to the antenna elements 420. A second metal layer 460 may be disposed on the bottom of the substrate 425. The auxiliary cavities 440 may be surrounded by metal plated-through vias 455, which may extend between the first metal layer 445 and the second metal layer 460. Alternatively, the walls of the auxiliary cavities 440 may have a layer of metallic material (e.g., gold plating, not shown) disposed thereon. The first metal layer 445 and/or the second metal layer 460 and the metal plated-through vias 455 may collect/radiate communication signals for the respective antenna elements 420 by reflecting such signals. Although not illustrated in FIG. 4 for the sake of clarity, a feed line (not shown) for each antenna element 420 also may be surrounded by additional metal plated-through vias (not shown).

Figure 5:
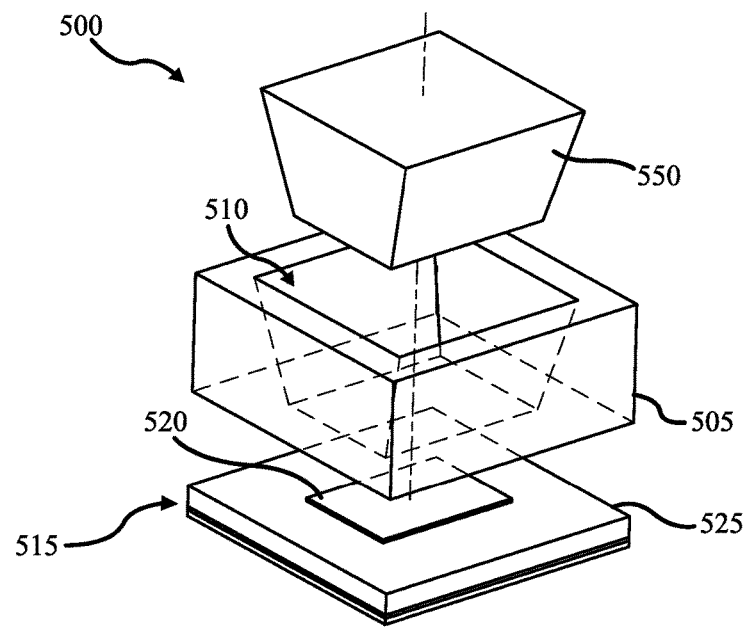
FIG. 5 shows an exploded perspective view of still another example of an antenna design, in accordance with various aspects of the present disclosure.

FIG. 5 shows an exploded perspective view of still another example of an antenna design 500, in accordance with various aspects of the present disclosure. As shown, the antenna design 500 may include an external housing 505 with a cavity 510 formed therein, and an antenna structure 515 including an antenna element 520 and a substrate 525 that supports the antenna element 520, each of which may be as described above with respect to FIGS. 2 and/or 3. As illustrated, the cavity 510 may have a pyramidal shape with four tapering walls, although other shapes (e.g., different cross-sectional perimeters, non-pyramidal, non-symmetric, etc.) may be employed. Further, the cavity 510 may be filled with a suitable dielectric material 550, such as described herein. Although not shown for the sake of simplicity, the antenna design 500 may include an auxiliary cavity for the cavity 510, such as described with respect to FIG. 4.

Figure 6:
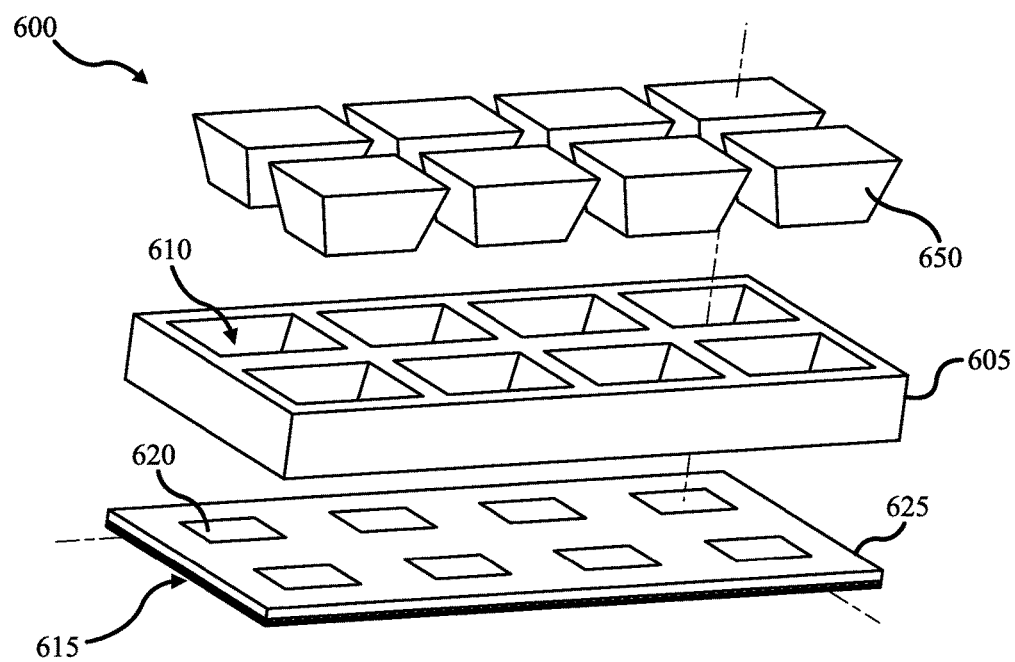
FIG. 6 shows an exploded perspective view of an example of an antenna array, in accordance with various aspects of the present disclosure.

FIG. 6 shows an exploded perspective view of an example of an antenna array 600, in accordance with various aspects of the present disclosure. As shown, the antenna array may include an external housing 605 with a plurality of cavities 610 formed therein, and an antenna structure 615 including antenna elements 620 and a substrate 625 that supports the antenna elements 620, each of which may be as described above with respect to FIGS. 2 and/or 3. Further, the cavity 610 may be filled with a suitable dielectric material 650, such as described herein. Although not shown for the sake of simplicity, the antenna array 600 may include an auxiliary cavity for each of the plurality of cavities 610, such as described with respect to FIG. 4. While the antenna array 600 shown is a 2×4 array, it should be understood that arrays of different numbers of antenna elements 620 and cavities 610 are possible as well.

Figure 7:
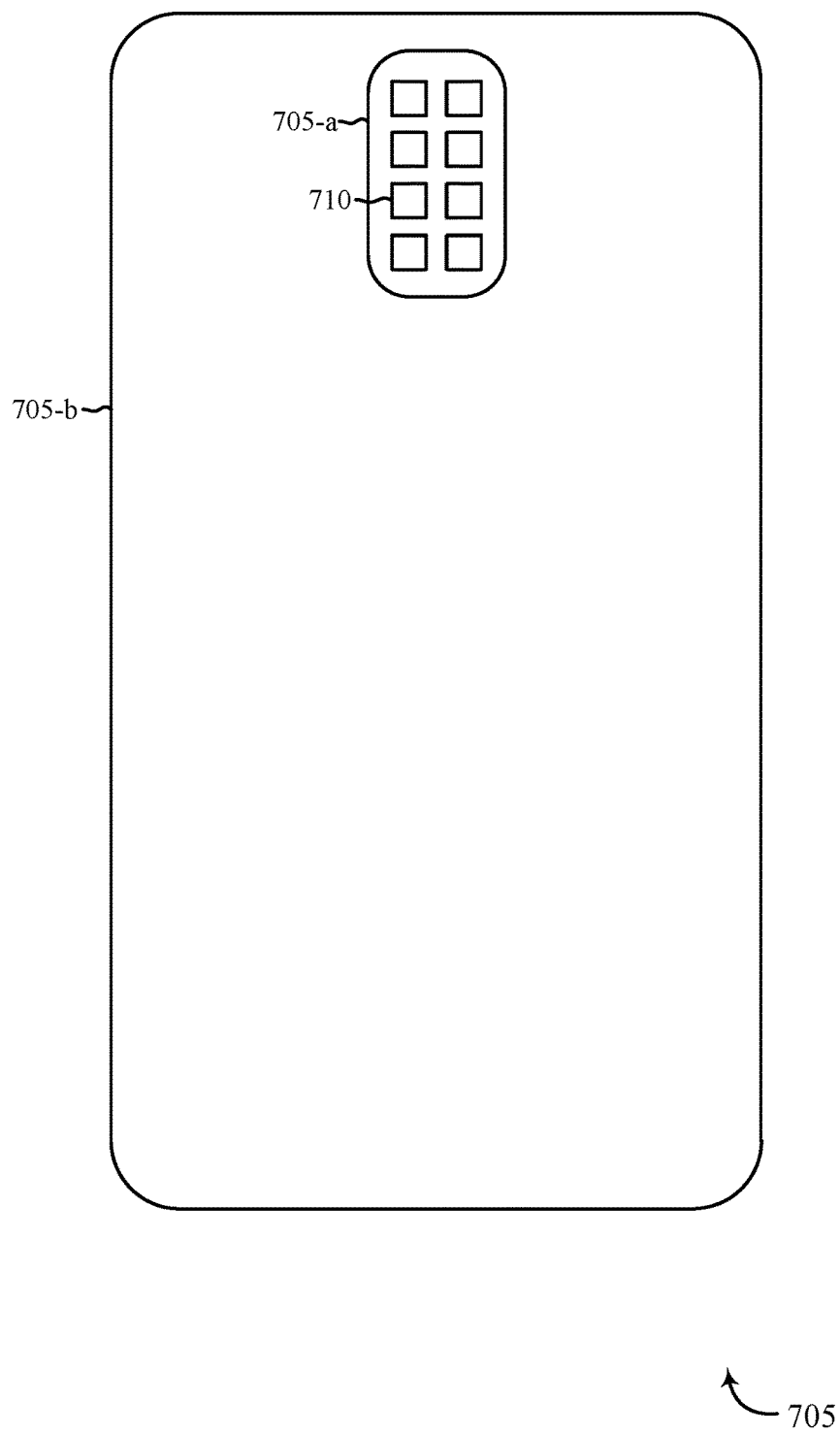
FIG. 7 shows an example of an external housing for a wireless communication device, in accordance with various aspects of the present disclosure.

FIG. 7 shows an example of an external housing 705 for a wireless communication device, in accordance with various aspects of the present disclosure. As described herein, the external housing 705 may be part of an antenna design for mmW communications. Thus, although specifically shown in FIG. 7 and not described again for the sake of brevity, it should be understood that the external housing 705 may be employed with various other features described herein to achieve a particular antenna design.

The external housing 705 may form a rear cover of a wireless communication device, such as a cellular telephone. While the external housing 705 is shown as having a particular shape, the shape shown is intended to be illustrative and not limiting.

The external housing 705 may include a first portion 705-a and a second portion 705-b. The first portion 705-a may have a plurality of cavities 710 formed therein. As such, the first portion 705-a may correspond generally to the sections of external housing 205/305/405/505/605 illustrated in FIGS. 2-6.

The first portion 705-a may be insertable into the second portion 705-b to form the external housing 705. For example, the first portion 705-a may be assembled with other components of a particular antenna design (e.g., antenna element(s), antenna substrate, RFIC, etc.), and then inserted into the second portion 705-*b*. The first and second portions 705-*a* and 705-*b* may be fitted together in any suitable manner (e.g., friction fit, mechanical connection, adhesive, etc.). In some cases, a coating (not shown) may be disposed over the external housing 705 after the first portion 705-*a* is inserted into the second portion 705-*b*, which also may serve to secure the first portion 705-*a* relative to the second portion 705-*b*. Alternatively or additionally, various connections between the components of the antenna design and other components of the wireless communication device may serve to secure the first portion 705-*a* relative to the second portion 705-*b* as such components are assembled to form the wireless communication device.

While FIG. 7 shows the external housing 705 as having separate first and second portions 705-*a* and 705-*b*, it should be understood that such portions may be integral with each other (e.g., a unitary or monolithic rear cover for the wireless communication device). In such case, no assembly may be required for the external housing 705 (although the external housing 705 may be assembled with other components (e.g., a front cover) for the wireless communication device).

Figure 8:
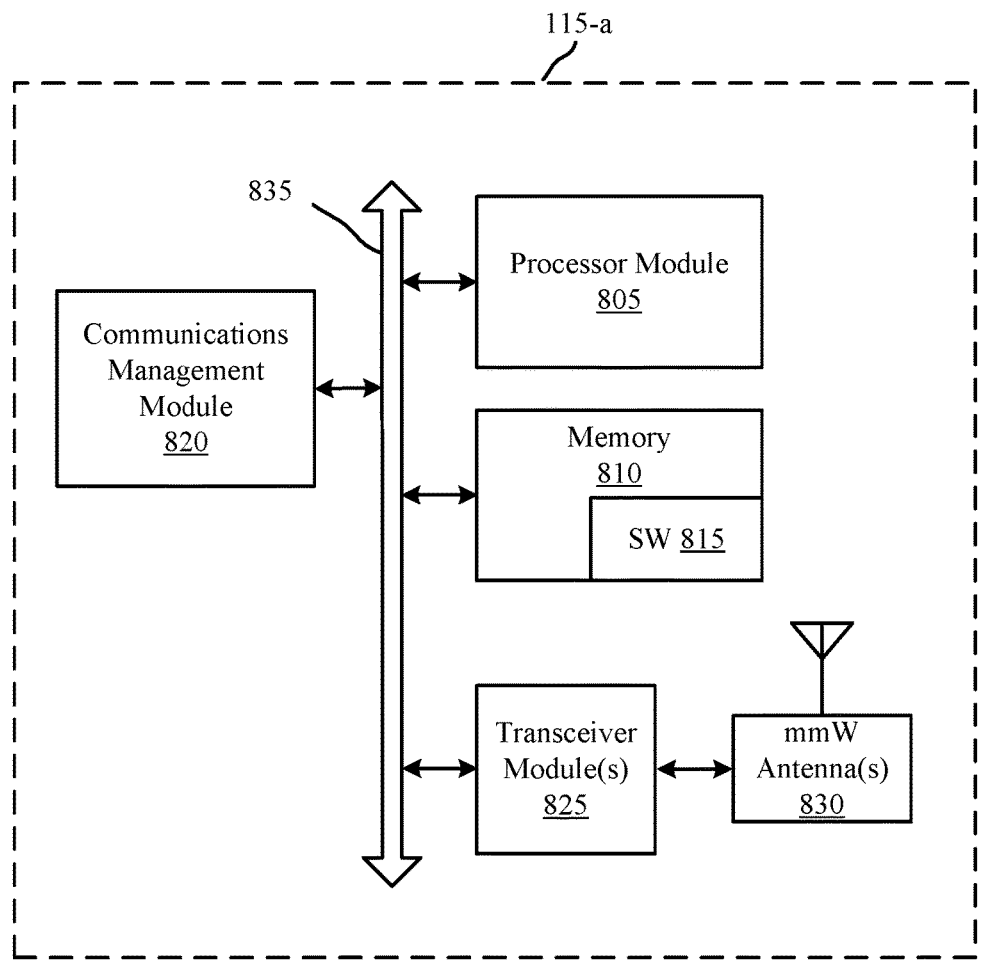
FIG. 8 shows a block diagram illustrating an example of an architecture for a device for use in wireless communication, in accordance with various aspects of the present disclosure.

FIG. 8 shows a block diagram 800 illustrating an example of an architecture for a device 115-*a* for use in wireless communication, in accordance with various aspects of the present disclosure. The UE 115-*a* may have various configurations and may be included or be part of a personal computer (e.g., a laptop computer, netbook computer, tablet computer, etc.), a cellular telephone (e.g., a smartphone), a PDA, a digital video recorder (DVR), an internet appliance, a gaming console, an e-reader, etc. The UE 115-*a* may in some cases have an internal power supply (not shown), such as a small battery, to facilitate mobile operation. The device 115-*a* may be an example of one or more aspects of a UE 115 described with reference to FIG. 1. The UE 115-*a* may implement at least some of the features and/or functions described with reference to FIGS. 1-7. The UE 115-*a* may communicate with a mmW base station 105 described with reference to FIG. 1.

The device 115-*a* may generally include components for bi-directional voice and data communications including components for transmitting communications and components for receiving communications. As described herein, the device 115-*a* may include one or more mmW antenna(s) 830 for receiving and/or transmitting mmW communication signals. The device 115-*a* also may include a processor module 805, memory 810 (including software (SW) 815), a communications management module 820 and one or more transceiver module(s) 825, each of which may communicate, directly or indirectly, with each other (e.g., via one or more buses 835).

The components of the device 115-*a* may, individually or collectively, be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented, in whole or in part, with instructions embodied in a memory, formatted to be executed by one or more general or application-specific processors.

The memory 810 may include random access memory (RAM) and/or read-only memory (ROM). The memory 810 may store computer-readable, computer-executable software (SW) code 815 containing instructions, when executed, cause the processor module 805 to perform various functions for wireless communications. Alternatively, the software code 815 may not be directly executable by the processor module 805 but may cause the device 115-*a* (e.g., when compiled and executed) to perform such functions.

The processor module 805 may include an intelligent hardware device, e.g., a CPU, a microcontroller, an ASIC, etc. The processor module 805 may process information received through the transceiver module(s) 825 and/or information to be sent to the transceiver module(s) 825 for transmission through the mmW antenna(s) 830. The processor module 805 may handle, alone or in connection with the communications management module 820, mmW communications via the mmW antenna(s) 830.

The transceiver module(s) 825 may be configured to communicate bi-directionally, via the mmW antenna(s) 830 and/or one or more wired or wireless links, with one or more networks, as described above with respect to FIG. 1. For example, the transceiver module(s) 825 may be configured to communicate bi-directionally with mmW base stations 105 as described with reference to FIG. 1. The transceiver module(s) 825 may include a modem configured to modulate packets and provide the modulated packets to the mmW antenna(s) 830 for transmission, and to demodulate packets received from the mmW antenna(s) 830. While the device 115-*a* may include a single mmW antenna 830, the device 115-*a* may have multiple mmW antennas 830 (e.g., an antenna array) capable of concurrently transmitting and/or receiving multiple wireless transmissions. The transceiver module(s) 825 may be capable of concurrently communicating with one or more base stations 105 via multiple component carriers.

The communications management module 820 may perform and/or control some or all of the features and/or functions described with reference to FIG. 1, as well as other features/functions for wireless communications as known in the art. The communications management module 820, or portions of it, may include a processor, and/or some or all of the functionality of the communications management module 820 may be performed by the processor module 805 and/or in connection with the processor module 805.

Figure 9:
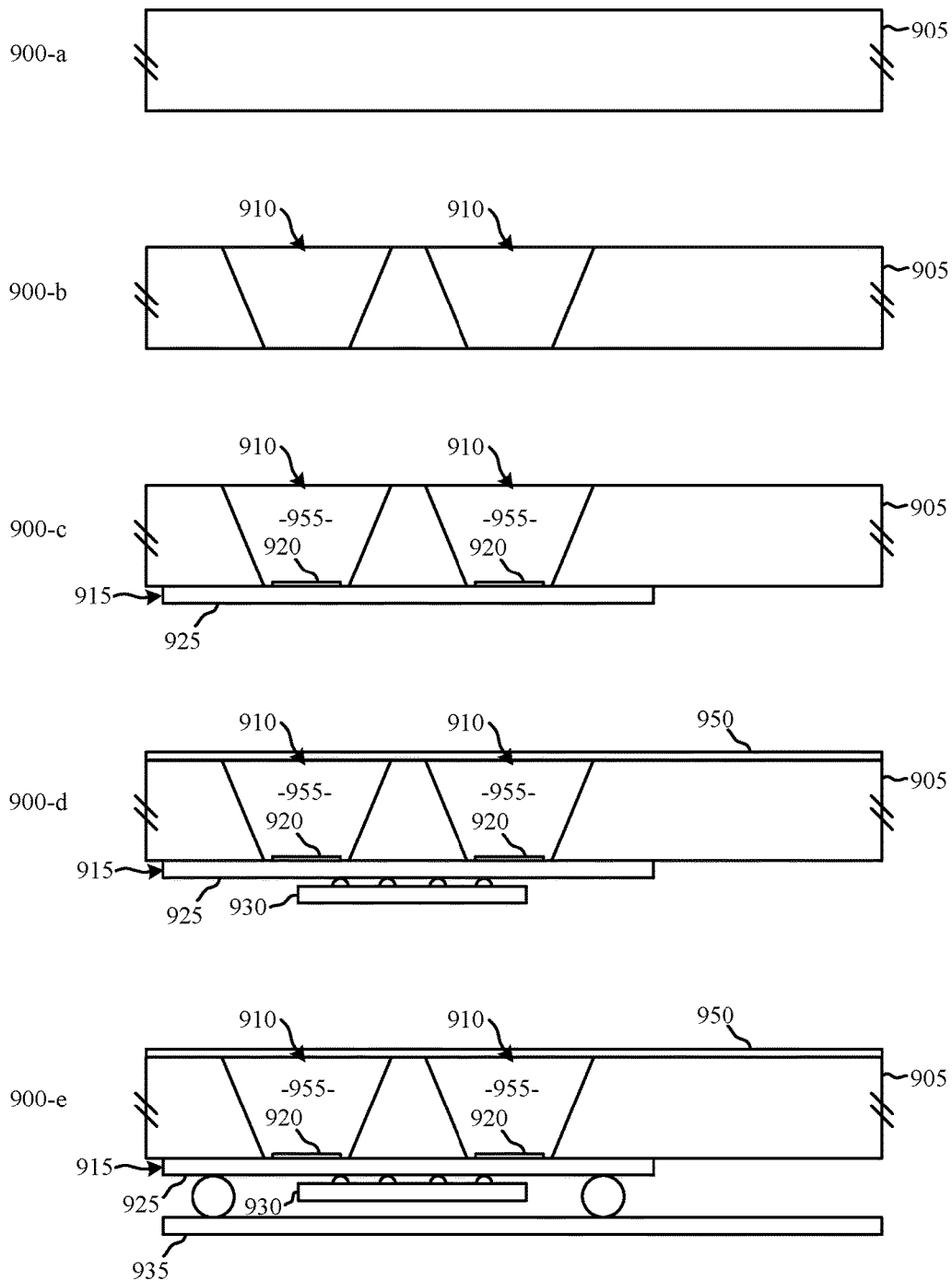
FIG. 9 shows a series of cross-sectional views illustrating an example of fabrication of an antenna design for a wireless communication device, in accordance with various aspects of the present disclosure.

FIG. 9 shows a series of cross-sectional views 900-*a* through 900-*e* illustrating an example of fabrication of an antenna design for a wireless communication device, in accordance with various aspects of the present disclosure. Fabrication may begin with an external housing 905 as shown in cross-sectional view 900-*a*.

As shown in cross-sectional view 900-*b*, one or more cavities 910 may be formed in the external housing 905. The cavities 910 may be formed in any suitable manner, such as by mechanically or chemically forming (e.g., cutting, punching, etching, etc.) vias through the external housing 905. Other techniques may be employed as well, such as casting, molding, etc. In such case, the cavities 910 may be formed when forming the external housing 905, such that fabrication may begin with the external housing 905 as shown in cross-sectional view 900-*b*.

An antenna structure 915 including a substrate 925 that supports one or more antenna elements 920 (corresponding to the cavities 910) may be assembled to the external housing 905 as shown in cross-sectional view 900-*c*. The antenna structure 915 may be secured relative to the external housing 905 in any suitable manner (e.g., mechanical connection, adhesive, friction fit (e.g., cooperating features), etc.).

In some cases, the cavities 910 may be filled with a suitable material 955 (e.g., a dielectric, such as a plastics material described herein). In such case, the material 955 may bond with or otherwise affix to the substrate 925 and/or the antenna elements 920 and/or may encapsulate the antenna elements 920 to help secure the antenna structure 915 relative to the external housing 905. Alternatively, the cavities 910 may be filled with a gas (e.g., air or a specific elemental composition) or evacuated.

As shown in cross-sectional view 900-d, a coating 950 may be applied over an outer surface of the external housing 905. The coating 950 may be applied in any suitable manner, for example, depending on the material of the coating 950 (e.g., deposition, spraying, adhering, laminating, etc.). The coating 950 may bond with or otherwise affix to the external housing 905, as well as the material 955 (e.g., in the case of a plastics material). In the case of the cavities being filled by a gas or a vacuum, the coating 950 may seal the cavities 910.

It should be understood that the order of the assembly of the antenna structure 915 to the external housing 905 and the application of the coating 950 to the external housing may be reversed, as appropriate or desired.

As also shown in cross-sectional view 900-d, an RFIC 930 may be electrically connected with the substrate 925. Such electrical connection may be achieved in any suitable manner, such as soldering or via adhesive with electrical contact between traces on the RFIC 930 and the substrate 925.

As shown in cross-sectional view 900-e, a main control board 935 of the wireless communication device may be electrically connected with the substrate 925. Again, such electrical connection may be achieved in any suitable manner, such as soldering or via adhesive with electrical contact between traces on the main control board 935 and the substrate 925.

The foregoing fabrication illustrated in FIG. 9 may be performed with the external housing 905 being made of a metallic material. As described herein, in the case where the external housing 905 is made of non-metallic (e.g., non-conductive) material, such as a plastics material, a layer of metallic material (not shown) may be added to the walls of the cavities 910 as part of the fabrication.

Figure 10:
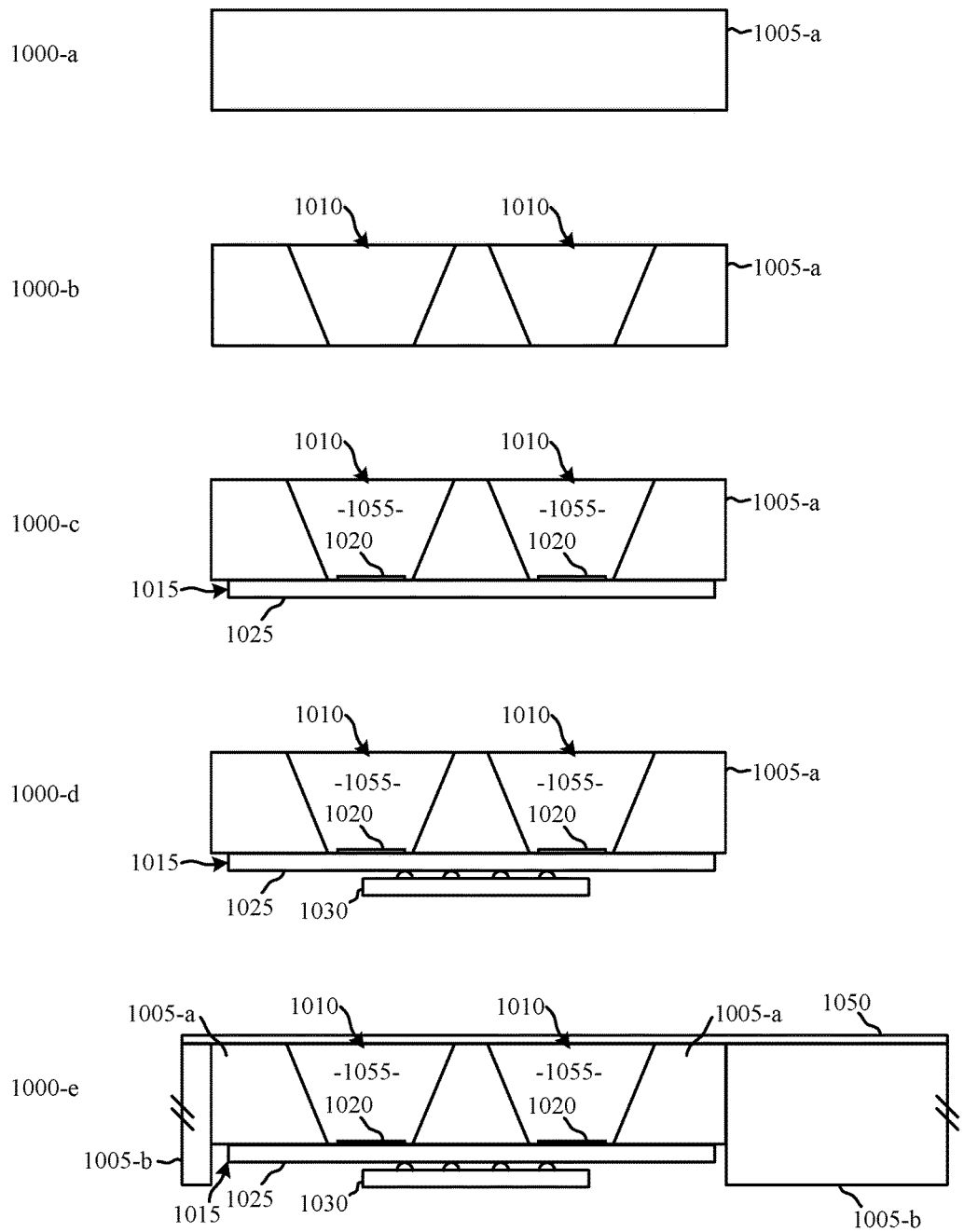
FIG. 10 shows a series of cross-sectional views illustrating another example of fabrication of an antenna design for a wireless communication device, in accordance with various aspects of the present disclosure.

FIG. 10 shows a series of cross-sectional views 1000-a through 1000-e illustrating another example of fabrication of an antenna design for a wireless communication device, in accordance with various aspects of the present disclosure. Fabrication may begin with a first portion 1005-a of an external housing as shown in cross-sectional view 1000-a.

As shown in cross-sectional view 1000-b, one or more cavities 1010 may be formed in the first portion 1005-a. The cavities 1010 may be formed in any suitable manner, such as by mechanically or chemically forming (e.g., cutting, punching, etching, etc.) vias through the first portion 1005-a. Other techniques may be employed as well, such as casting, molding, etc. In such case, the cavities 1010 may be formed when forming the first portion 1005-a, such that fabrication may begin with the first portion 1005-a as shown in cross-sectional view 1000-b.

An antenna structure 1015 including a substrate 1025 that supports one or more antenna elements 1020 (corresponding to the cavities 1010) may be assembled to the first portion 1005-a as shown in cross-sectional view 1000-c. The antenna structure 1015 may be secured relative to the first portion 1005-a in any suitable manner (e.g., mechanical connection, adhesive, friction fit (e.g., cooperating features), etc.).

In some cases, the cavities 1010 may be filled with a suitable material 1055 (e.g., a dielectric, such as a plastics material described herein). In such case, the material 1055 may bond with or otherwise affix to the substrate 1025 and/or the antenna elements 1020 and/or may encapsulate the antenna elements 1020 to help secure the antenna structure 1015 relative to the first portion 1005-a. Alternatively, the cavities 1010 may be filled with a gas (e.g., air or a specific elemental composition) or evacuated.

As shown in cross-sectional view 1000-d, an RFIC 1030 may be electrically connected with the substrate 1025. Such electrical connection may be achieved in any suitable manner, such as soldering or via adhesive with electrical contact between traces on the RFIC 1030 and the substrate 1025.

As shown in cross-sectional view 1000-e, the first portion 1005-a, with the antenna structure 1015 and the RFIC 1030 assembled thereto, may be inserted into a second portion 1005-b of the external housing. For example, the first and second portions 1005-a and 1005-b may be fitted together to form the external housing (e.g., a rear cover of the wireless communication device), such as described above with respect to FIG. 7. Further, a coating 1050 may be disposed over the external housing (formed by the assembly of the first portion 1005-a with the second portion 1005-b).

It should be understood that the assembly of the antenna structure 1015 to the first portion 1005-a may be performed after the assembly of the first portion 1005-a with the second portion 1005-b. Further, filling the cavities 1010 with the material 1055 may be performed after the assembly of the first portion 1005-a with the second portion 1005-b.

Although not shown, additional fabrication of the wireless communication device (e.g., adding a main control board such as described with respect to FIG. 10) may be performed as well.

The foregoing fabrication illustrated in FIG. 10 may be performed with the first portion 1005-a of the external housing being made of a metallic material. As described herein, in the case where the first portion 1005-a is made of non-metallic (e.g., non-conductive) material, such as a plastics material, a layer of metallic material (not shown) may be added to the walls of the cavities 1010 as part of the fabrication.

Figure 11:
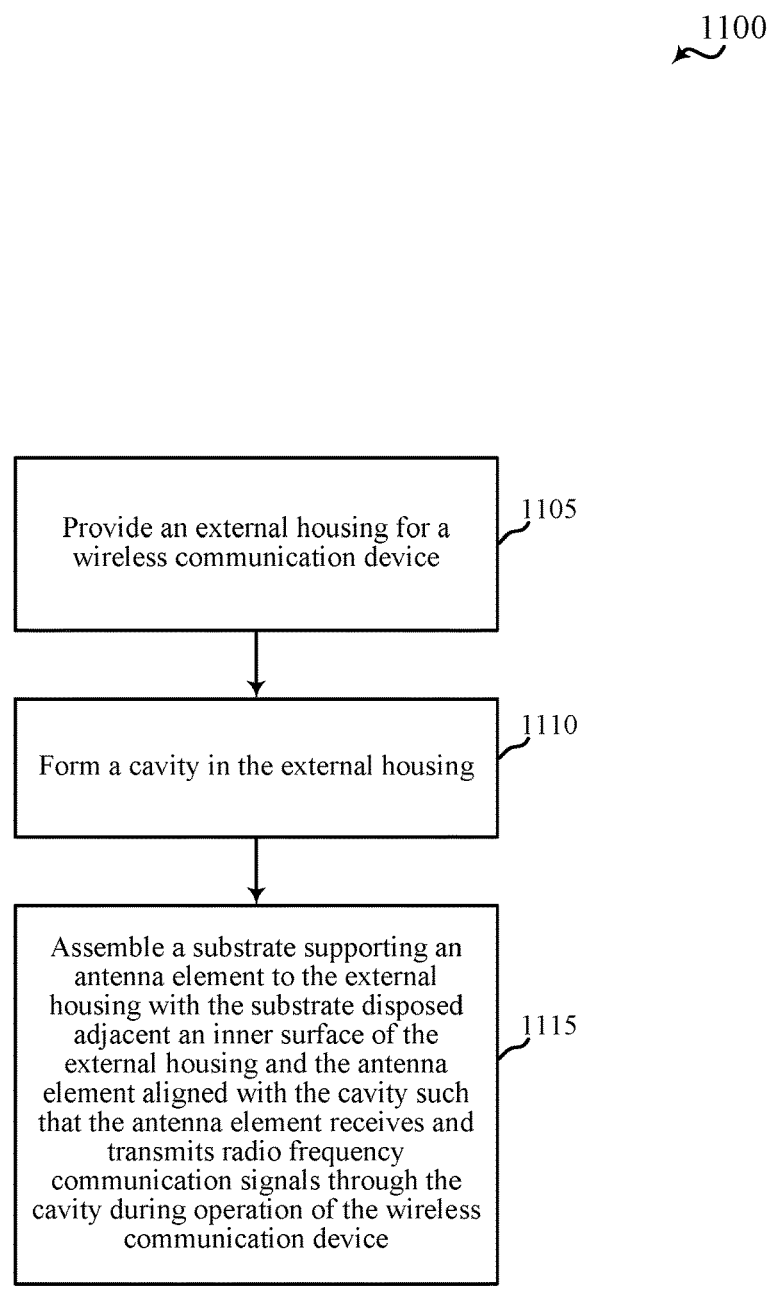
FIG. 11 is a flow chart illustrating an example of a method of fabricating an antenna design for a wireless communication device, in accordance with various aspects of the present disclosure.

FIG. 11 is a flow chart illustrating an example of a method 1100 of fabricating an antenna design for a wireless communication device, in accordance with various aspects of the present disclosure. For clarity, the method 1100 is described below with reference to aspects of one or more of the features described with reference to FIGS. 2-10. It should be understood that the various features incorporated will vary according to a particular antenna design. As such, the method 1100 should be understood to be representative in nature and not to exhaustive.

At block 1105, the method 1100 may involve providing an external housing for a wireless communication device. As described herein, this may involve providing a unitary housing, such as a back cover of the wireless communication device.

At block 1110, the method 1100 may involve forming a cavity in the external housing. As described herein, the operations of blocks 1105 and 1110 may be merged, for example, when the external housing is formed (e.g., molded) to include the cavity.

Then, at block 1115, a substrate supporting an antenna element may be assembled to the external housing. Such assembly may be performed such that the substrate is disposed adjacent an inner surface of the external housing and the antenna element is aligned with the cavity. Such alignment may configure the antenna element to receive and/or transmit radio frequency communications signals (e.g., mmW) through the cavity during operation of the wireless communication device.

Thus, the method 1100 may provide an antenna design for a wireless communication device. It should be noted that the method 1100 is just one implementation and that the operations of the method 1100 may be rearranged or otherwise modified such that other implementations are possible.

Figure 12:
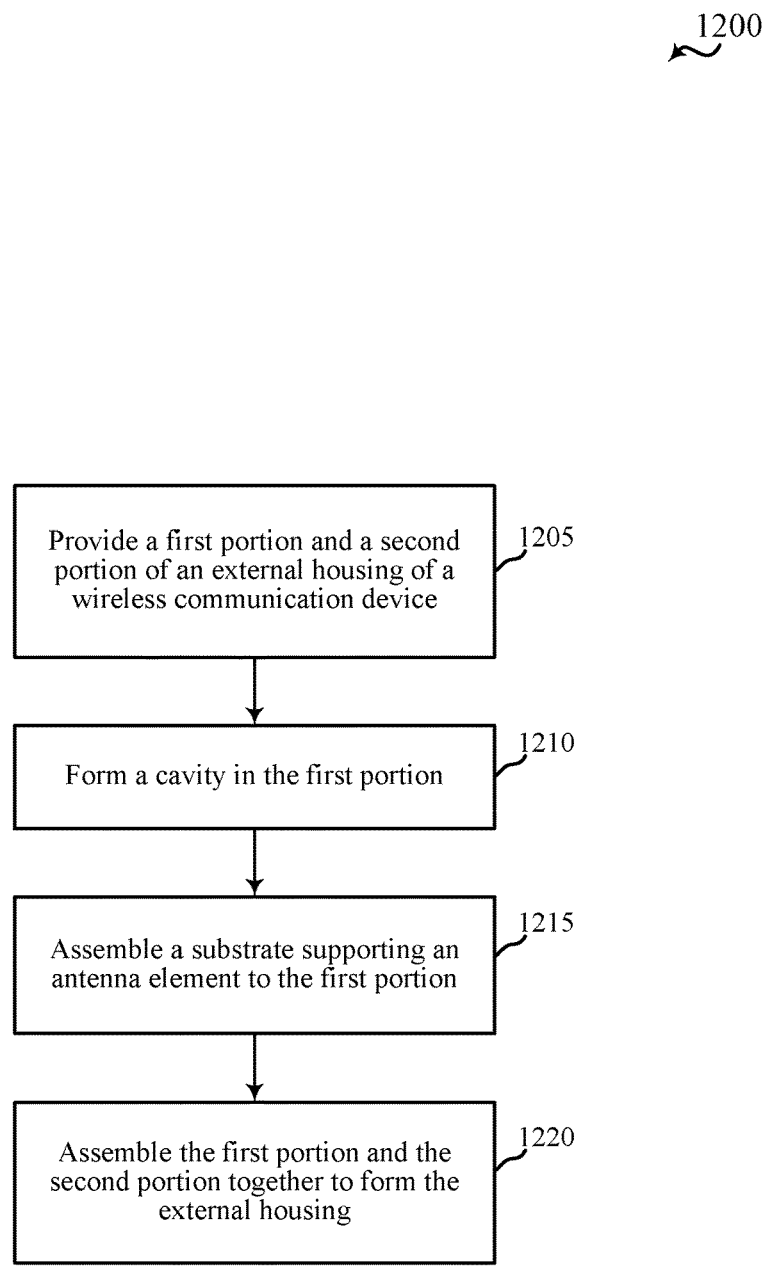
FIG. 12 is a flow chart illustrating another example of a method of fabricating an antenna design for a wireless communication device, in accordance with various aspects of the present disclosure.

FIG. 12 is a flow chart illustrating an example of another method 1200 of fabricating an antenna design for a wireless communication device, in accordance with various aspects of the present disclosure. For clarity, the method 1200 is described below with reference to aspects of one or more of the features described with reference to FIGS. 2-8 and 10. It should be understood that the various features incorporated will vary according to a particular antenna design. As such, the method 1200 should be understood to be representative in nature and not to exhaustive.

At block 1205, the method 1200 may involve providing a first portion and a second portion of an external housing for a wireless communication device. As described herein, this may involve providing a first portion that may be assembled with the second portion to form the external housing.

At block 1210, the method 1200 may involve forming a cavity in the first portion. As described herein, the operations of blocks 1205 and 1210 may be merged, for example, when the first portion is formed (e.g., molded) to include the cavity.

At block 1215, a substrate supporting an antenna element may be assembled to the first portion of the external housing. This assembly may be performed, for example, as described above with respect to FIG. 10.

Then, at block 1220, the first portion and the second portion may be assembled together to form the external housing. Thus, the method 1200 also may provide an antenna design for a wireless communication device. It should be noted that the method 1200 is just one implementation and that the operations of the method 1200 may be rearranged or otherwise modified such that other implementations are possible.

Techniques described herein may be used for various wireless communications systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (WiFi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over an unlicensed and/or shared bandwidth. The description above, however, describes an LTE/LTE-A system for purposes of example, and LTE terminology is used in much of the description above, although the techniques are applicable beyond LTE/LTE-A applications.

The detailed description set forth above in connection with the appended drawings describes examples and does not represent the only examples that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone;

B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A handheld wireless communication device, comprising: an external housing; a substrate supporting an antenna element and disposed adjacent an inner surface of the external housing, the antenna element comprising a plurality of antenna elements of an antenna array, each of the plurality of antenna elements comprising a millimeter wavelength antenna element; a cavity formed in the external housing, the cavity aligned with the antenna element such that the antenna element receives and transmits radio frequency communication signals through the cavity during operation of the handheld wireless communication device, the cavity comprising a plurality of cavities, each of the plurality of cavities aligned with a corresponding one of the plurality of antenna elements; and a plurality of auxiliary cavities formed in the substrate and aligned with a corresponding one of the plurality of cavities and the corresponding one of the plurality of antenna elements, each of the auxiliary cavities configured to reflect at least some of the radio frequency communication signals towards the corresponding one of the plurality of antenna elements.

2. The wireless communication device of claim 1, wherein the external housing comprises a metallic material.

3. The wireless communication device of claim 1, wherein the external housing comprises a plastics material, further comprising:
   a metallic material disposed on a wall of the at least one cavity.

4. The wireless communication device of claim 1, wherein a wall of the cavity is tapered to slope towards the antenna element.

5. The wireless communication device of claim 1, further comprising:
   a dielectric material that fills the cavity and has an external surface coplanar with the external housing.

6. The wireless communication device of claim 5, wherein the dielectric material comprises a plastics material.

7. A wireless communication device, comprising:
   an external housing;
   a substrate supporting an antenna element and disposed adjacent an inner surface of the external housing, the antenna element comprising a plurality of antenna elements of an antenna array, each of the plurality of antenna elements comprising a millimeter wavelength antenna element; and
   a cavity formed in the external housing, the cavity aligned with the antenna element such that the antenna element receives and transmits radio frequency communication signals through the cavity during operation of the wireless communication device, the cavity comprising a plurality of cavities, each of the plurality of cavities aligned with a corresponding one of the plurality of antenna elements, the plurality of cavities including outer perimeter cavity walls and inner non-perimeter cavity walls, all of the outer perimeter cavity walls being tapered to slope towards a corresponding one of the plurality of antenna elements and all of the inner non-perimeter cavity walls not being tapered.

8. The wireless communication device of claim 1, wherein the external housing includes a first portion and a second portion, the cavity formed in the second portion of the external housing, the substrate disposed adjacent to at least an inner surface of the first portion of the external housing.

9. The wireless communication device of claim 8, wherein the first portion is insertable into the second portion to form the external housing.

10. The wireless communication device of claim 1, further comprising:
    a layer of material on an exterior surface of the external housing, the layer of material covering the cavity formed in the external housing.

11. A handheld wireless communication device, comprising:
    means for housing the wireless communication device;
    means for supporting an antenna element, the means for supporting disposed adjacent an inner surface of the means for housing, the antenna element comprising a plurality of antenna elements of an antenna array, each of the plurality of antenna elements comprising a millimeter wavelength antenna element;
    a cavity formed in the means for housing, the cavity aligned with the antenna element such that the antenna element receives and transmits radio frequency communication signals through the cavity during operation of the handheld wireless communication device, the cavity comprising a plurality of cavities, each of the plurality of cavities aligned with a corresponding one of the plurality of antenna elements; and a plurality of auxiliary cavities formed in the substrate and aligned with a corresponding one of the plurality of cavities and the corresponding one of the plurality of antenna elements, each of the auxiliary cavities configured to reflect at least some of the radio frequency communication signals towards the corresponding one of the plurality of antenna elements.

12. The wireless communication device of claim 11, wherein the means for housing comprises a metallic material.

13. The wireless communication device of claim 11, wherein the means for housing comprises a plastics material, further comprising:

a metallic material disposed on a wall of the at least one cavity.

14. The wireless communication device of claim 11, wherein a wall of the cavity is tapered to slope towards the antenna element.

15. The wireless communication device of claim 11, further comprising:

means for filling the cavity to have an external surface coplanar with the external housing.

16. The wireless communication device of claim 15, wherein the means for filling comprises a plastics material.

17. A wireless communication device, comprising:

means for housing the wireless communication device;

means for supporting an antenna element, the means for supporting disposed adjacent an inner surface of the means for housing, the antenna element comprising a plurality of antenna elements of an antenna array, each of the plurality of antenna elements comprising a millimeter wavelength antenna element; and a cavity formed in the means for housing, the cavity aligned with the antenna element such that the antenna element receives and transmits radio frequency communication signals through the cavity during operation of the wireless communication device, the cavity comprising a plurality of cavities, each of the plurality of cavities aligned with a corresponding one of the plurality of antenna elements, the plurality of cavities including outer perimeter cavity walls and inner non-perimeter cavity walls, all of the outer perimeter cavity walls being tapered to slope towards the corresponding one of the plurality of antenna elements and all of the inner non-perimeter cavity walls not being tapered.

18. The wireless communication device of claim 11, wherein the means for housing includes a first portion and a second portion, the cavity formed in the second portion of the means for housing, the substrate disposed adjacent to at least an inner surface of the first portion of the means for housing.

19. The wireless communication device of claim 18, wherein the first portion is insertable into the second portion to form the means for housing.

20. The wireless communication device of claim 11, further comprising:

a layer of material on an exterior surface of the means for housing, the layer of material covering the cavity formed in the means for housing.

21. The wireless communication device of claim 1, wherein the antenna element is disposed at least partially in the cavity.

22. The wireless communication device of claim 11, wherein the antenna element is disposed at least partially in the cavity.

* * * * *